United States Patent
Chittipeddi et al.

(10) Patent No.: US 7,727,894 B2
(45) Date of Patent: Jun. 1, 2010

(54) FORMATION OF AN INTEGRATED CIRCUIT STRUCTURE WITH REDUCED DISHING IN METALLIZATION LEVELS

(75) Inventors: Sailesh Chittipeddi, Allentown, PA (US); Sailesh Merchant, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 25 days.

(21) Appl. No.: 11/649,015

(22) Filed: Jan. 3, 2007

(65) Prior Publication Data

US 2007/0228572 A1    Oct. 4, 2007

Related U.S. Application Data

(60) Provisional application No. 60/756,056, filed on Jan. 4, 2006.

(51) Int. Cl.
- *H01L 21/311* (2006.01)
- *H01L 21/4763* (2006.01)
- *H01L 21/302* (2006.01)
- *H01L 21/461* (2006.01)

(52) U.S. Cl. .............. 438/697; 438/631; 438/637; 438/691; 438/692

(58) Field of Classification Search .......... 438/637–638
See application file for complete search history.

(56) References Cited

U.S. PATENT DOCUMENTS

| 6,653,224 | B1 * | 11/2003 | Gotkis et al. ............. 438/627 |
| 2002/0048934 | A1 * | 4/2002 | Shieh et al. ............. 438/631 |
| 2006/0249482 | A1 * | 11/2006 | Wrschka et al. ............. 216/88 |

* cited by examiner

*Primary Examiner*—Ha Tran T Nguyen
*Assistant Examiner*—Valerie Brown

(57) ABSTRACT

An integrated circuit structure includes a metallization level having a dual damascene trench structure formed in a layer of dielectric material. The dielectric material has an upper surface with a first degree of planarity. The metallization level includes a conductive layer formed in the trench structure with an upper surface characterized by the same level of planarity as the dielectric material upper surface. In certain embodiments, the upper surface of the conductive layer is substantially coplanar with the dielectric material upper surface.

14 Claims, 2 Drawing Sheets

ND AN INTEGRATED CIRCUIT
FORMATION OF AN INTEGRATED CIRCUIT STRUCTURE WITH REDUCED DISHING IN METALLIZATION LEVELS

PRIOR PROVISIONAL PATENT APPLICATION

The present application claims the benefit of U.S. Provisional Application No. 60/756,056 filed Jan. 4, 2006, the disclosure of which is hereby incorporated by reference.

FIELD OF THE INVENTION

The present invention is directed to the formation of integrated circuit damascene interconnect structures, and more particularly, to reduction of the "dishing" that occurs during such formation in the metallization levels of the conductor/insulator interconnect structures.

BACKGROUND OF THE INVENTION

Copper damascene technology has become the choice of metal interconnect technology in deep submicron silicon device manufacturing. Damascene structures used in integrated circuit technology comprise layers of conductor formed within layers of insulator material such that the top surfaces of the two layers are coplanar. The insulator material is patterned and etched to create vias and trenches which are then filled with conductive material.

Dual damascene processing involves the formation of an opening having a lower contact or via opening section which communicates with an upper trench section. The entire opening is then filled with a conductive material to simultaneously form a runner and a contact or via connecting runners in different levels of interconnect. An advantage of the dual damascene process is that the contact or via and the overlying trench (metal line) are formed simultaneously.

Excess conductive material on the surface of the inter-metal dielectric layer is then removed by a process called Chemical-Mechanical Polishing (CMP) which involves polishing with a slurry comprising abrasive particles suspended in a chemically reactive liquid. Surfaces subjected to CMP are simultaneously exposed to both chemical and mechanical polishing on a rotating platen. The removal rate of material from a surface undergoing CMP is dependent on a number of factors, including the materials being removed, the hardness and size of the slurry particles, the reactivity of the slurry liquid, the flow rate at which slurry is introduced, the rotational speed of the platen, and the pressure between the surface being polished and the platen.

FIG. 1 illustrates a step in a conventional integrated circuit fabrication sequence wherein a dual damascene metallization level, e.g., formed by electroplated copper, has been formed in a low constant ("low-k") dielectric material 10. The low-k dielectric material 10 is formed over a relatively high-k etch stop layer, while the upper surface of the low-k dielectric material 10 is typically protected from damage during the manufacturing process by formation of an overlying capping layer (e.g., a silicon oxide, silicon nitride, silicon carbide or a combination thereof).

As illustrated in FIG. 1, after being planarized by CMP, the metal runners 12 exhibit a characteristic dishing effect along an upper surface of each runner. This is in contrast as shown to the relatively planar disposition of the hard dielectric capping layer.

Although CMP has been successfully implemented for copper damascene technology, it is becoming more difficult to fabricate finer metal line widths and pitches due to formation of the dished metal surfaces. The amount of dishing after CMP may vary based on metal geometry and pattern density. In practice it is often necessary to continue CMP beyond the stage illustrated in FIG. 1 in order to remove residual copper and barrier metal traces from regions along the surface which may be distant from the trenches. With subsequent formation of a next level of interconnect, the shape of the dished copper surface 12 is passed on to the overlying inter-metal dielectric layer stack.

Generally, it has been difficult to limit the extent of dishing due to the combination of a relatively soft metal such as copper and a relatively hard dielectric capping layer covering the low-k dielectric material during the CMP process. Thus, as can be seen, a need exists for an improved method of forming damascene metallization levels in low-k dielectric layers with reduced dishing.

SUMMARY OF THE INVENTION

Accordingly, the present invention is directed to minimizing or essentially reducing dishing of a conductive material surface in a damascene metallization process of forming integrated circuits.

In an aspect of the invention an integrated circuit structure includes a metallization level having a dual damascene trench structure formed in a layer of dielectric material. The dielectric material has an upper surface with a first degree of planarity. The metallization level includes a conductive layer formed in the trench structure with an upper surface characterized by the same level of planarity as the upper surface of the dielectric material. In certain embodiments, the upper surface of the conductive layer is substantially coplanar with the upper surface of the dielectric material.

A method of fabricating an integrated circuit structure includes forming a capping layer of given thickness over an upper surface of a layer of dielectric material, defining a damascene via structure below the upper surface and within the layer of dielectric material, and defining, a damascene trench structure below the upper surface in connection with the via structure and within the layer of dielectric material. The trench structure is filled and the capping layer is covered with conductive material. Some of the conductive material is removed to expose the capping layer. The thickness of the capping layer is reduced to expose a newly defined upper surface of the capping material. A dished surface formed in the remaining conductive material is positioned above the upper surface of the dielectric material. A portion of the dished region is removed to impart a portion of the exposed conductive material with a degree of planarity substantially equal to the planarity of the capping material.

The present invention, including its features and advantages, will become more apparent from the following detailed description with reference to the accompanying drawings.

DETAILED DESCRIPTION

FIGS. 2 through 5 illustrate the differing stages in an exemplary fabrication sequence for forming trenches and vias of an interconnect structure in an integrated circuit and thereby reduce dishing in the metallization levels. Although not illustrated, the integrated circuit includes a semiconductor layer in which a plurality of transistor devices are formed. A plurality of metallization levels are formed over the semiconductor layer to create an interconnect structure.

Figure 2:
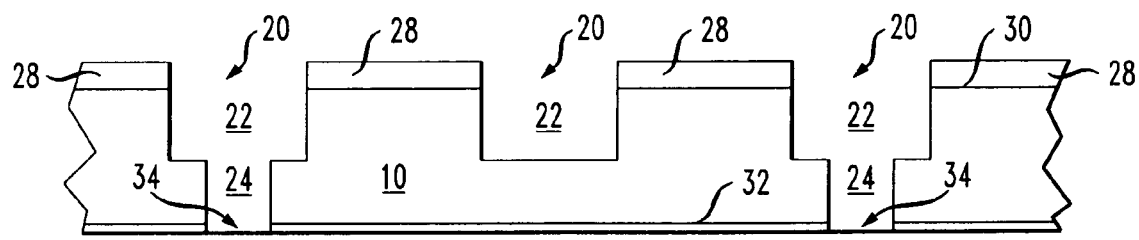
FIG. 2 illustrates a partial cross sectional view of an integrated circuit in the fabrication sequence wherein dual damascene structures have been etched in the low-k dielectric material, according to an embodiment of the present invention.

Referring now to FIG. 2, a structure in an integrated circuit fabrication sequence according to the present invention is illustrated, wherein dual damascene structures 20 have been etched in the low-k dielectric material 10. The dielectric material 10 may comprise a multi-layer structure having one or more dielectric materials. The illustrated structures 20 each include a runner, or trench, portion 22, and an underlying via portion 24 for connection with conductor(s) in an underlying metallization level. The structures, once complete, may constitute an intermediate metallization level or a final metallization level in a multi-level interconnect system of an integrated circuit structure.

A relatively thick layer 28 of etch stop material (e.g., silicon carbide, silicon nitride, silicon oxynitride, silicon oxycarbide, silicon carbo-nitride or a combination thereof) has been formed and retained over the uppermost surface 30 of dielectric material 10 while portions of a layer 32 of etch stop material at the bottoms 34 of the via portions 24 have been removed to expose underlying conductors (not shown). Generally, as described below, the thickness of the layer 28 can be varied based on the amount of dishing which is to be avoided in the final structure.

Figure 3:
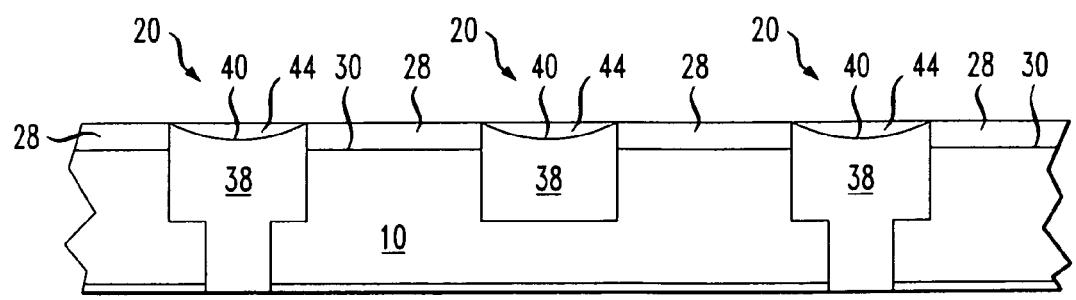
FIGS. 3 and 4 illustrate partial cross sectional views of an integrated circuit during different stages in the fabrication sequence, according to an embodiment of the present invention.

Referring next to FIG. 3, a layer 38 of conductive material, such as copper, has been deposited in the structures 20 and over the etch stop layer, 28, followed by removal of the conductive material, e.g., by chemical mechanical polishing, until the layer 38 is planarized along an upper surface of the etch stop material 28. Dished regions 40 are present in the layer 38. Preferably, and in the example illustrated in FIG. 3, the dished regions do not at all extend below the etch stop material. It is preferred that the lowest portions of the dished regions 40 be spaced above the uppermost surface 30 of the dielectric material 10. More generally, the dished regions 40 may be positioned either partly or completely above the uppermost surface 30 of the dielectric material 10. A layer 44 of planarizing material (such as photoresist or spin-on-glass) is deposited in sufficient thickness to completely fill the dished regions and provide overburden above the etch stop layer 28. Portions of the layer 44 are then removed, e.g., by reactive ion etching, to expose the layer 28 of etch stop material while the dished regions remain covered with material of the layer 44.

Figure 4:
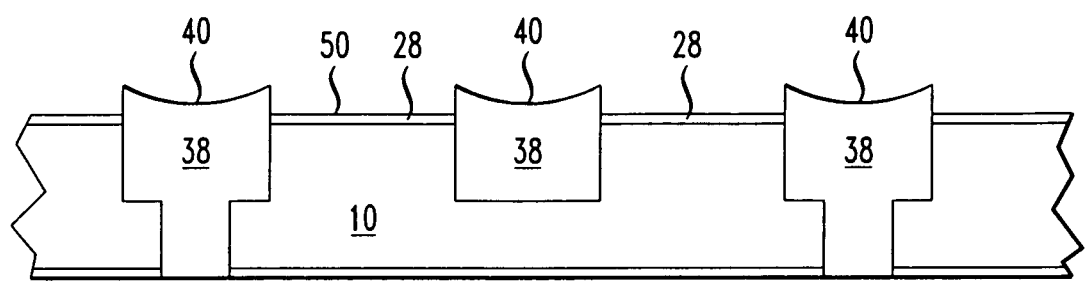

Referring next to FIG. 4, the layer 28 is etched or polished with a slurry to thin the layer 28. The removal process should exhibit high selectivity relative to the material of the conductive layer 38, and continue until the dished regions are completely exposed, with the lowest portion of each dished region 40 positioned at or above a plane defined by the newly exposed upper surface 50 of the layer 28. The slurry composition is then changed in order to remove the dished regions with a high selectivity relative to the material of the layer 28. Accordingly, resulting planarization of the conductive material along the upper surface 50 removes part or, preferably, all of the dished regions.

Figure 5:
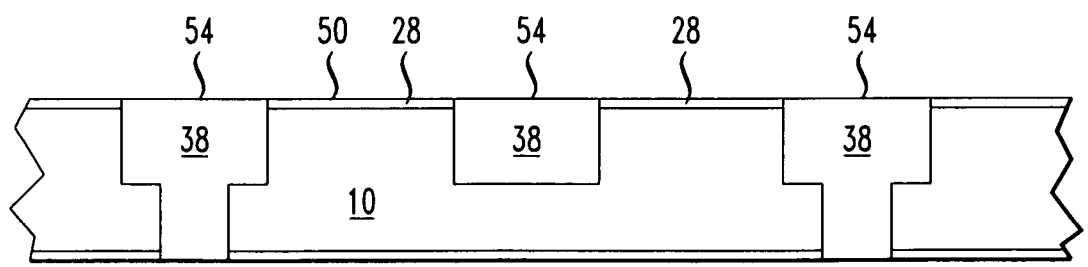
FIG. 5 illustrates a partial cross sectional view of an integrated circuit at an end stage in the fabrication sequence, according to an embodiment of the present invention.

As shown in FIG. 5, the newly defined upper surface 54 of the layer 38 is not dished. The surface 54 is closely aligned or co-planar with the plane defined by the upper surface 50 of the layer 28. The layer 28 may then, as an option, be removed. Subsequently, further etch stop material and/or a dielectric stack may be deposited over the exposed surface such that other additional levels of metallization may be formed thereover.

Figure 1:
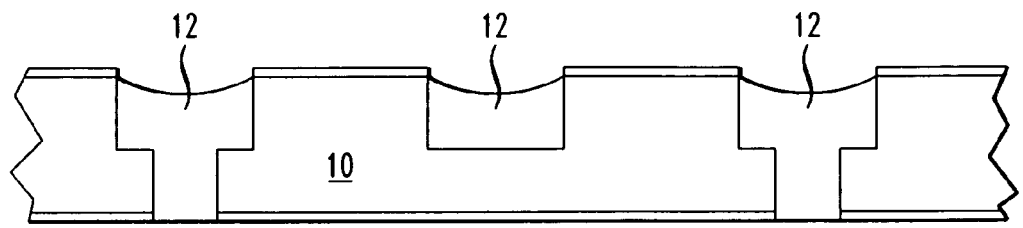
FIG. 1 illustrates a partial cross sectional view of a dual damascene metallization structure, according to the prior art.

Generally, the layer 28 is of sufficient initial thickness (see FIG. 2) that the majority or all of each dished region 40 formed within the conductor material is above the plane defined by the upper surface of the layer of dielectric material 10. When the dished regions are formed above the layer of dielectric material 10, the polishing processes impart a degree of planarity to the upper surface of conductor material which is substantially the same as the planarity of the upper surface of the dielectric material. This is to be compared to the differential planarity between the upper surface of the dielectric material 10 and the dished runners 12 shown in FIG. 1.

Although a simple example of the invention has been described it will be understood by those skilled in the art that the concepts may be readily applied to a variety of circuit metallization structures composed of varying materials and of varying dimensions.

In the foregoing description, the method and apparatus of the present invention have been described with reference to specific examples. It is to be understood and expected that variations in the principles of the method and apparatus herein disclosed may be made by one skilled in the art and it is intended that such modifications, changes, and substitutions are to be included within the scope of the present invention as set forth in the appended claims. The specification and the drawings are accordingly to be regarded in an illustrative rather than in a restrictive sense.

What is claimed is:

1. A method of fabricating an integrated circuit structure, comprising:

defining a damascene structure in dielectric material;

forming a layer of etch stop material on an upper surface of the dielectric material;

forming a layer of conductive material in the damascene structure and over a least a portion of an upper surface of the layer of etch stop material;

removing at least a portion of the layer of conductive material until an upper surface of the layer of conductive material is substantially coplanar with the upper surface of the layer of etch stop material, wherein one or more dished regions are formed in the upper surface of the layer of conductive material, a lowest portion of the one or more dished regions being spaced above the upper surface of the layer of etch stop material;

forming a layer of planarizing material in at least a portion of the one or more dished regions such that an upper surface of the layer of planarizing material is substantially coplanar with the upper surface of the layer etch stop material;

removing at least a portion of the layer of etch stop material until at least a portion of sidewalls of the one or more dished regions are expose above a newly exposed upper surface of the layer of etch stop material;

removing at least a portion of the upper surface of the layer of conductive material until the upper surface of the layer of conductive material is substantially coplanar with the newly exposed upper surface of the layer of etch stop material.

2. The method according to claim 1, wherein the step of forming the layer of planarizing material in at least a portion of one or more dished regions in the conductive material comprises forming the layer of planarizing material such that a cross-sectional thickness of the layer of planarizing material is greater at a lowest portion of the one or more dished regions compared to a cross- sectional thickness of the layer of the planarizing material at an edge of the one or more dished region.

3. The method according to claim 1, wherein the removal of the portion of the upper surface of the layer of conductive material is accomplished by chemical mechanical polishing.

4. The method according to claim 1, wherein the fabrication occurs over a semiconductor wafer having transistor devices formed thereon.

5. The method according to claim 1, wherein the fabrication occurs for multiple metallization levels.

6. The method according to claim 1, wherein the removal of the portion of the upper surface of conductive material comprises removing the layer of the planarizing material in the one or more dished regions in the conductive material.

7. The method according to claim 1, wherein the dielectric material comprises a capping layer.

8. An integrated circuit structure comprising:
a damascene structure defined in dielectric material;
a layer of etch stop material formed on an upper surface of the dielectric material;
a layer of conductive material formed by the steps of:
forming the layer of conductive material in the damascene structure and over at least a portion of an upper surface of the layer of etch stop material;
removing at least a portion of the layer of conductive material until an upper surface of the layer of conductive material is substantially coplanar with the upper surface of the layer of etch stop material, wherein one or more dished regions are formed in the upper surface of the layer of conductive material, a lowest portion of the one or more dished regions being spaced above the upper surface of the layer of etch stop material;
forming a layer of planarizing material in at least of the one or more dished regions such that an upper surface of the layer of planarizing material is substantially coplanar with the upper surface of the layer of etch stop material;
removing at least a portion of the layer of etch stop material until at least a portion of sidewalls of the one or more dished regions are exposed above a newly exposed upper surface of the layer of etch stop material;
removing at least a portion of the upper surface of the layer of conductive material until the upper surface of the layer of conductive material is substantially coplanar with the newly exposed upper surface of the layer of etch stop material.

9. The structure according to claim 8, wherein the step of forming the layer of planarizing material in at least a portion of one or more dished regions in the conductive material comprises forming the layer of planarizing material such that a cross-sectional thickness of the layer of planarizing is greater at a lowest portion of the one or more dished regions compared to a cross-sectional thickness of the layer of planarizing material at an edge of the one or more dished regions.

10. The structure according to claim 8, wherein the removal of the portion of the upper surface of the layer of conductive material is accomplished by chemical mechanical polishing.

11. The structure according to claim 8, wherein the structure further comprises:
a layer of semiconductive material having transistors devices formed therein.

12. The structure according to claim 8, wherein the structure has multiple metallization levels.

13. The structure according to claim 8, wherein the removal of the portion of the upper surface of the layer of conductive material comprises removing the layer of the planarizing material in the one or more dished regions in the conductive material.

14. The structure according to claim 8, wherein the dielectric material comprises a capping layer.

\* \* \* \* \*

UNITED STATES PATENT AND TRADEMARK OFFICE
CERTIFICATE OF CORRECTION

PATENT NO. : 7,727,894 B2  Page 1 of 1
APPLICATION NO. : 11/649015
DATED : June 1, 2010
INVENTOR(S) : S. Chittipeddi et al.

It is certified that error appears in the above-identified patent and that said Letters Patent is hereby corrected as shown below:

In the claims:

Claim 1, col. 4, line 46, please delete "a least" and insert --at least--.

Claim 1, col. 4, line 64, please delete "expose" and insert --exposed--.

Claim 2, col. 5, line 12, please delete "region" and insert --regions--.

Claim 6, col. 5, line 22, please insert --of the layer-- after "surface".

Claim 8, col. 6, line 1, please insert --a portion-- after "least".

Claim 9, col. 6, line 20, please insert --material-- after "planarizing".

Claim 11, col. 6, line 30, please delete "semiconductive" and insert --semiconductor--.

Claim 11, col. 6, line 30, please delete "transistors" and insert --transistor--.

Signed and Sealed this

Twelfth Day of October, 2010

David J. Kappos
*Director of the United States Patent and Trademark Office*